United States Patent
King et al.

(10) Patent No.: US 6,417,792 B1
(45) Date of Patent: Jul. 9, 2002

(54) SINGLE PHASE BI-DIRECTIONAL ELECTRICAL MEASUREMENT SYSTEMS AND METHODS USING ADCS

(75) Inventors: Eric T. King, Temple; Douglas F. Pastorello, Hudson; Bruce P. Del Signore, Hollis; Victor Aguilar, Nashua, all of NH (US); Frank Den Breejen, Austin, TX (US); William F. Gardei, Derry, NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/484,688

(22) Filed: Jan. 18, 2000

(51) Int. Cl.[7] .................................................. H03M 3/00
(52) U.S. Cl. ...................................... 341/143; 364/492
(58) Field of Search ............................... 341/155, 143, 341/156, 118, 120, 139; 324/142; 364/492, 736; 708/313

(56) References Cited

U.S. PATENT DOCUMENTS

| | | | | |
|---|---|---|---|---|
| 5,345,409 A | * | 9/1994 | McGrath et al. .............. 364/736 |
| 5,485,393 A | * | 1/1996 | Bradford ..................... 364/483 |
| 5,537,333 A | * | 7/1996 | Hemminger et al. ......... 364/492 |
| 5,544,089 A | * | 8/1996 | Hemminger et al. ......... 364/492 |
| 5,631,843 A | * | 5/1997 | Munday et al. .............. 364/492 |
| 5,924,050 A | * | 7/1999 | Maruyama ................... 702/60 |
| 6,236,197 B1 | * | 5/2001 | Holdsclaw et al. ........... 324/110 |
| 6,260,053 B1 | * | 7/2001 | Maulik et al. ................ 708/313 |
| 6,262,672 B1 | * | 7/2001 | Brooksby et al. ........... 340/870.1 |

* cited by examiner

Primary Examiner—Brian Young
Assistant Examiner—John B Nguyen
(74) Attorney, Agent, or Firm—Steven Lin, Esq.

(57) ABSTRACT

An analog to digital converter system includes first and second delta sigma converters, a calculation engine, and a serial interface on a single chip. The calculation engine is configured to calculate energy, power, rms current and voltage for single phase 2 or 3 wire power meters. Voltage and current are measured with a shunt or transformer, and a divider or transformer, respectively. The serial interface is bidirectional for communication with a microprocessor or controller, and provides a fixed width programmable frequency output proportional to energy. The digital converter system is user system calibratible.

21 Claims, 13 Drawing Sheets

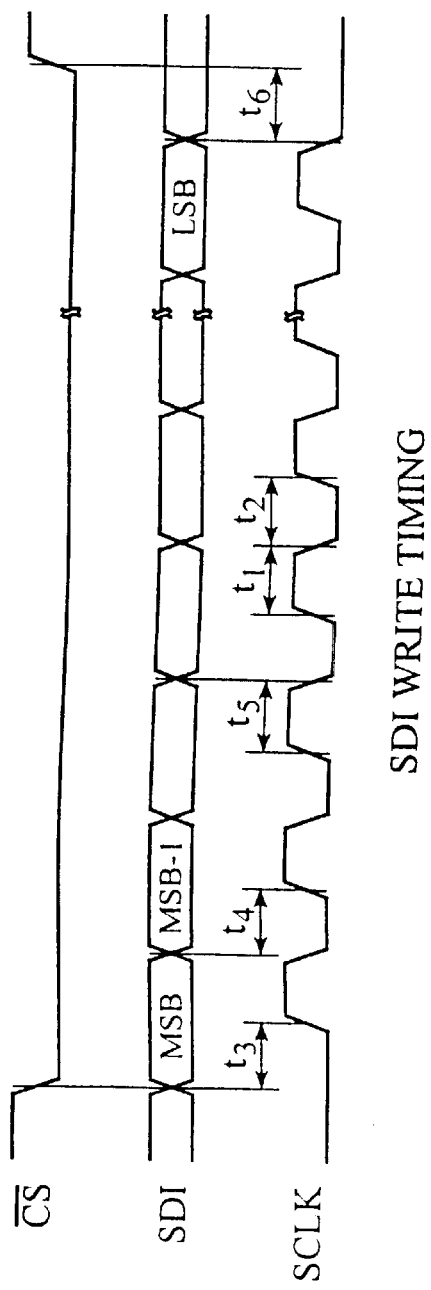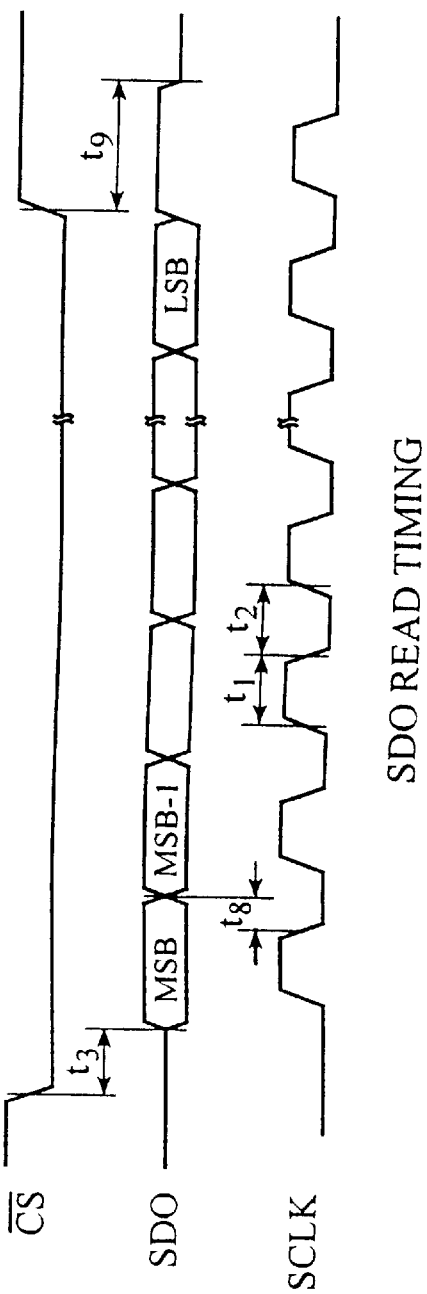

SINGLE PHASE BI-DIRECTIONAL ELECTRICAL MEASUREMENT SYSTEMS AND METHODS USING ADCS

BACKGROUND OF THE INVENTION

1. Field of the Invention

This invention relates to power and energy measurement systems and methods, and more particularly to single phase bi-directional power and energy systems and methods which are configured on a single semiconductor chip.

2. Description of the Related Art

Power and energy measurement systems of many kinds are well-known. Many of such systems are electromechanical. Many of these systems are inaccurate and consume excessive power.

There is a need for accurate power and energy measurement systems having enhanced functionality, which are nonetheless inexpensive and which consume reduced energy levels to operate.

SUMMARY OF THE INVENTION

According to one embodiment of the present invention, a power and energy measurement system of enhanced accuracy performs a plurality of functions including energy and power measurement, root mean square voltage and root means square current determination, and energy to pulse-rate conversion. The measurement system has reduced power consumption and has an interface which is optimized for operation with a shunt sensor. The measurement system includes a phase compensation system and operates with ground-referenced signals and a single power supply. The system further has a calibration system, including a feature for providing a settable offset useful for determining power level calculations. Further, according to one embodiment of the present invention, the single phase bidirectional power energy system provides an energy data accuracy of 0.1% of reading in one second over 300:1 dynamic range. The system provides a tool to measure and calculate eneregy, power and root mean square current and voltage, while providing a reduced level of power consumption. Further, an interface is optimized for inclusion of a shunt sensor, enabling a low input range and use of a small value resistor, enabling use of a simplified voltage regulator. Further, useful system calibration features according to the present invention, allow an offset to be used for voltage and current calculations. According to one embodiment of the present invention, a monolithic CMOS power measurement device includes an energy computation engine. The device includes a programmable gain amplifier, two delta sigma modulators, two high rate filters, a system calibrator, a power calculator with functions to compute energy, rms voltage, rms current, and instantaneous power. The device performs power meter functions while interfaced to shunt current transformers for current measurement and a voltage transformer or resistive divider to measure voltage. The device includes a programmable gain amplifier in the current channel to accommodate various input voltage levels due to shunts, permitting measurements of 150 or 300 mV rms. The device includes first and second high rate digital filters which output data at a (MCLK/K)/1024 output word rate. A high pass filter in each channel is used to remove DC content prior to energy calculation. The device is further adapted according to the present invention to interface effectively with a microprocessor, controller, or microcontroller over a three wire serial interface which is SPI-compatible and microwire-compatible. The device further includes a serial port which includes a Schmitt Trigger input on its serial clock to accommodate slow rise time signals.

BRIEF DESCRIPTION OF THE DRAWINGS

FIG. 2A is an SDI write timing diagram according to the present invention;

FIG. 2B is an SDO read timing diagram according to the present invention;

DESCRIPTION OF PREFERRED EMBODIMENTS OF THE INVENTION

Figure 1:
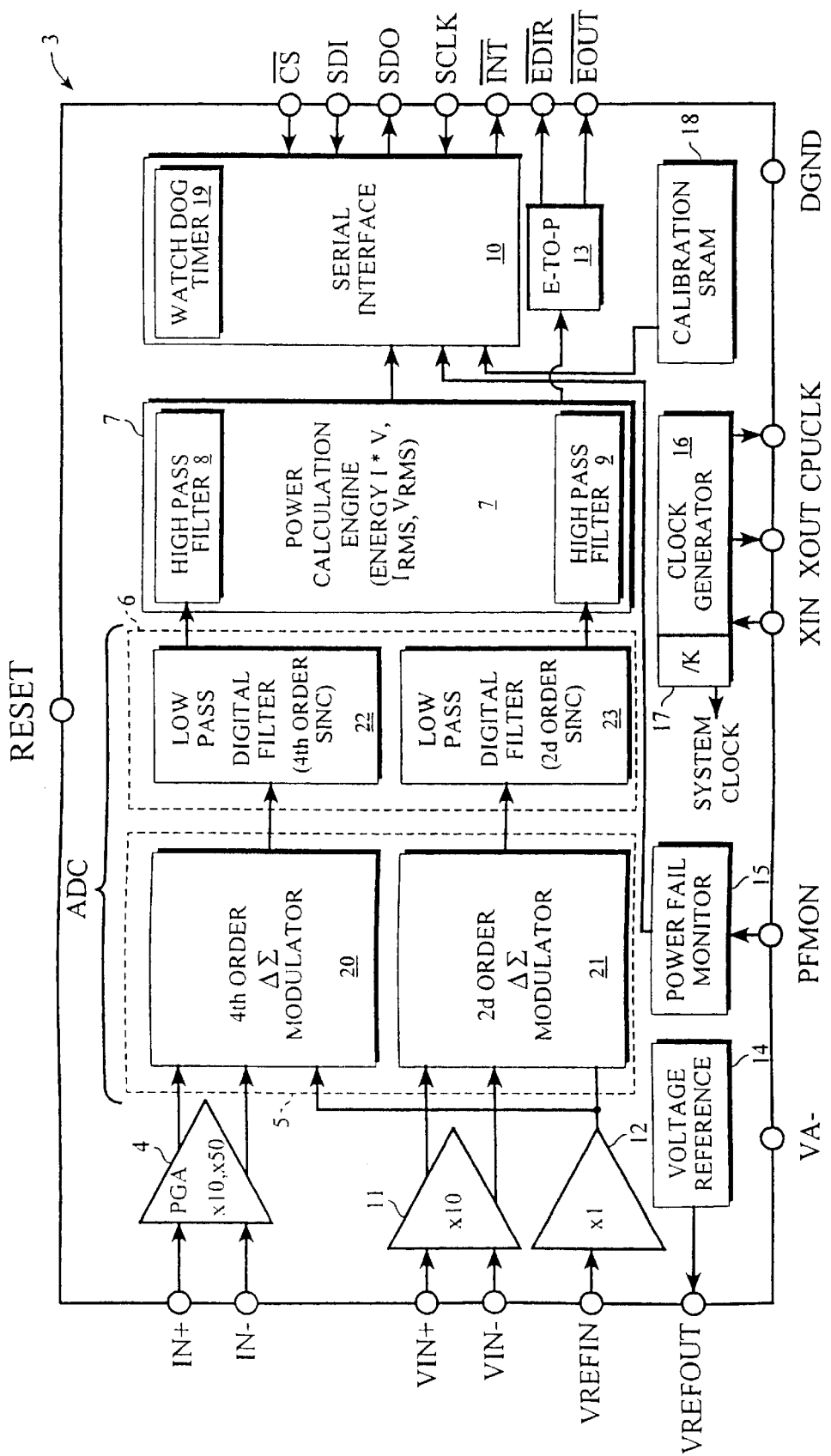
FIG. 1 is a block diagram of a energy and power measurement system according to the present invention.

Referring now to FIG. 1, there is shown a block diagram of an energy and power measurement system 3 according to the present invention. The energy and power measurement system 3 includes a programmable gain amplifier (PGA) 4 for receiving current measurement signals, an analog-to-digital (A/D) modulator system 5 connected to the PGA 4, a digital filter system 6 connected to the modulator system 5, and a calculation engine 7 for making power, energy, rms voltage, and rms current calculations. The programmable gain amplifier 4 has differential inputs according to one embodiment of the present invention, to promote noise immunity. The measurement system 3 further includes first and second high pass filters 8 and 9 for connecting the calculation engine 7 to the modulator system 5. The first and second high pass filters, 8 and 9, remove the DC content from the voltage and current signals channels prior to information processing by the calculation engine 7. According to one embodiment of the present invention, the calculation engine 7 produces a new energy value on the order of every second. The measurement system 3 according to one embodiment of the present invention further includes a serial interface 10, first and second amplifiers 11 and 12, an energy to pulse (E-to-P) converter 13, a voltage reference 14, a power fail monitor 15, a clock generator 16, a frequency divider 17 and a calibration SRAM 18. The voltage reference 14 provides an on-board reference voltage for user convenience, albeit a reference subject to drift, as it is a CMOS device-based reference source. This enables operation of low-accuracy systems without a separate precision voltage source. The power fail monitor 15 monitors the source of power for the chip or board on which the system 3 is operative, causing an interrupt to be activated in the absence of adequate power, in turn permitting the system to prepare for power-down, by saving critical values, for example.

The clock generator 16 has XIN, XOUT and CPUCLK terminals, the XIN and XOUT terminals providing crystal input and output connections, and the CPUCLK terminal serving as an output signal connection for clocking or driving another device, such as a microprocessor on board, to enable synchronous inter communication. The frequency divider 17 permits establishment of a reduced frequency system clock which is reduced from the clock signal produced by the clock generator 16 by a divisor K, where K=1, 2, or 4, for example. Calibration SRAM 18 is a register used in calibration of the serial interface 10. The serial interface 10, according to one embodiment of the present invention, includes a watchdog timer 19 which is adapted to check a microprocessor energy register for energy readings, which, if absent, cause the watchdog timer to set an interrupt indicating the absence of energy readings.

Figure 3:
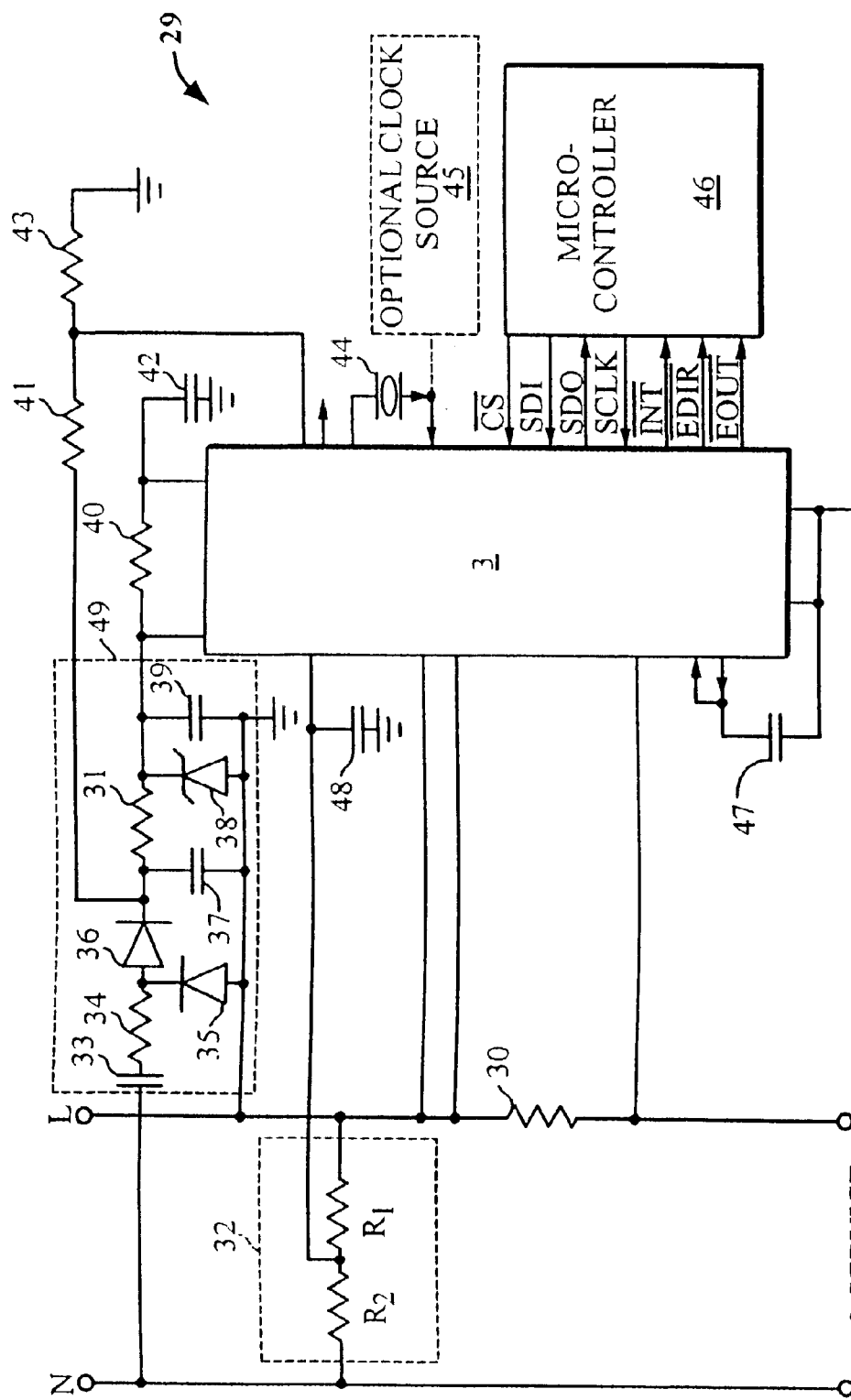
FIG. 3 is a connection diagram for the energy and power measurement system according to one embodiment of the present invention for a one phase two wire system.

The first amplifier 11 receives input voltage measurement signals. The first amplifier 11 has differential inputs according to one embodiment of the present invention, to promote noise immunity, and it is adapted by virtue of the differential inputs to be used with a shunt resistor or with a sensor transformer, as shown in FIGS. 2 and 3. The second amplifier 12 receives a voltage reference signal. The serial interface 10 is bi-directional and enables communication with a micro-controller and provides a fixed-width programmable frequency output that is proportional to energy. According to one embodiment of the present invention, the modulator system 5 includes a fourth order delta sigma modulator 20, a second order delta sigma modulator 21, and first and second digital filters 22 and 23. The digital filters according to one embodiment of the present invention are each low pass filters adapted to eliminate quantization noise incident to modulation. According to one embodiment, digital filter 22 is a fourth order SINC filter, and digital filter 23 is a second order sinc filter. According to one embodiment of the present invention, the first and second digital filters 22 and 23 output data at a (MCLK/K)/1024 output word rate (OWR). According to one embodiment of the present invention, the measurement system 3 combines two delta sigma ADCs, various electrical and power calculation functions, and a serial interface on a single semiconductor chip. More particularly, the measurement system 3 is designed to measure and calculate energy, instantaneous power, root mean square current, and root mean square voltage for single phase two or three wire power meter applications. Further, the measurement system 3 is configured according to the present invention to interface to a shunt or transformer to measure current and to a resistive divider or transformer to measure voltage. The measurement system 3 is initialized and functional at power-up and is configured to enable user controlled system-level calibration.

Referring now to FIG. 2A, there is shown an SDI write timing diagram according to the present invention. SDI is an input connection for the serial interface 10 (MSB first, LSB last). The timing diagram describes the operation of data writes to the serial interface relative to transitions of a train of clock pulses. Referring now to FIG. 2B, there is shown an SDO read timing diagram according to the present invention. SDO is an output connection for the serial interface 10. The timing diagram describes the operation of data reads from the serial interface.

Referring now to FIG. 3, there is shown a connection diagram of an electric system 29 including the energy and power measurement system 3 according to one embodiment of the present invention, for a one-phase two-wire system. The electric system 29 further includes first and second electric lines or wires, N and L, which are connected to the measurement system 3 as shown. In particular, line L is connected to the VIN−, IIN−, and IIN+ inputs of the measurement system 3. Line L includes a current sensor in the form, according to one embodiment, of a resistor 30 acting as a current sensor by enabling current to be determined from a voltage measured across its known resistance value. Voltage is measured with a voltage sensor 32 having for example the character of first and second resistors connected to each other at a common node, with respective ones of the resistors being in turn connected to lines N and L. The common node is connected to VIN+ and to a capacitor 48 to ground. Connections VREFIN and VREFOUT are connected through a capacitor 47 to connections VA− and DGND of measurement system 3. Connections VA+, VD+, and PFMON are connected to lines L and N through charge pump circuitry 49 including a first capacitor 33, a first resistor 34, first and second diodes respectively 35 and 36, a second resistor 31, a second capacitor 37, a zener diode 38, a third capacitor 39; third, fourth and fifth resistors 40, 41, and 43; and a fourth capacitor 42. The electric system 29 further includes according to one embodiment a crystal oscillator 44 and an optional clock source 45 (shown in phantom), connected to connections XOUT and XIN in the case of oscillator 44 and to XIN in the case of clock source 45. If the optional clock source is used, the crystal oscillator 44 is not needed. The electric system 29 further includes a microcontroller 46 which is connected to the measurement system 3 at the connections SCLK, $\overline{\text{CS}}$, SDI, SDO, $\overline{\text{INT}}$, $\overline{\text{EDIR}}$, and $\overline{\text{EOUT}}$.

The measurement system 3 is connected to operate from a single +5V supply, according to one embodiment, or from dual plus and minus 2.5V supplies according to another embodiment. This permits provision of a 300 mV rms or 150 mV rms range for the current channel and to provide a 150 mV rms range for the voltage channel. With a single supply, the measurement system 3 accommodates common mode signals of −0.25V to VA+. FIG. 3 further shows a configuration of the electric system 29 subject to measurement connected to a service to enable measurement of power in a single-phase two wire system while operating in a single supply configuration. In particular, the electric system 29 includes a shunt resistor 30 for measuring current in line or wire L. Additionally, the electric system 29 includes a resistive voltage divider 32 for measuring voltage between lines or wires N and L. The resistive divider 32 includes according to one embodiment, first and second series resistors (R1 and R2) connected to each other at a common node. The ends of the respective resistors not connected to the common node are respectively connected to line or wire N or L.

Figure 4:
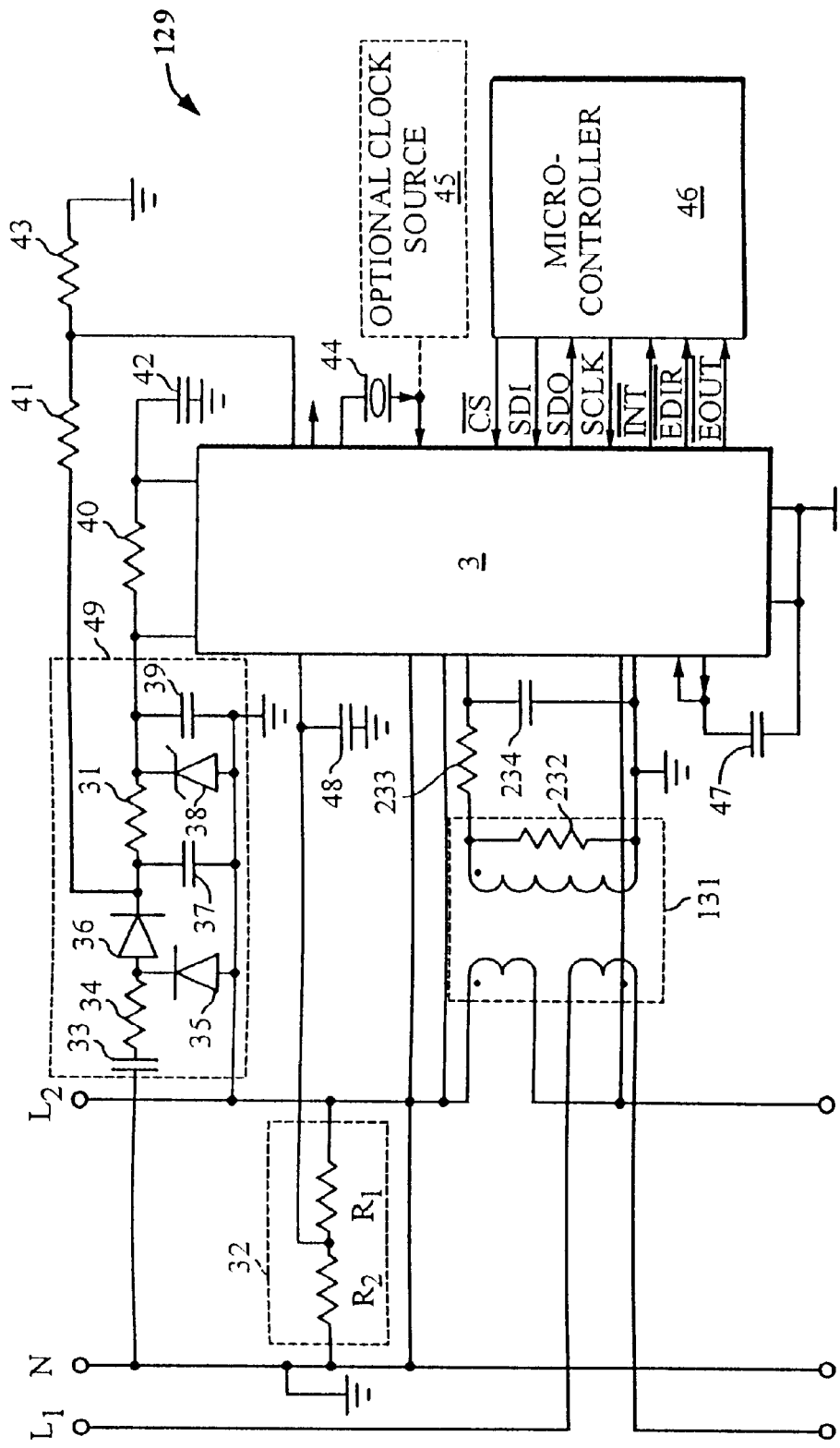
FIG. 4 is a connection diagram for the energy and power measurement system according to one embodiment of the present invention for a one phase three wire system.

Referring now to FIG. 4, there is shown a connection diagram for another electrical system 129 including the measurement system 3 according to an embodiment of the present invention which is applicable for a one-phase three-wire system. The electric system 129 further includes first, second, and third electric lines or wires N, L1, and L2; which are connected to measurement system 3 as shown. Lines L1 and L2 are connected to a current sensor 131 in the form, according to one embodiment, of a transformer having a primary coil including coils included in line L1 and line L2.

The measurement system 3 has connections IIN+ and IIN– which are coupled to a secondary coil of the current sensor transformer through a resistor 233 connected to the measurement system input connection IIN+. Another resistor 232 is connected across the secondary coil of the transformer. Further, a capacitor 234 is connected across input connections IIN+ and IIN–. Voltage is measured with a voltage sensor 32 having, for example, the character of first and second resistors connected to each other at a common node, with respective ones of the resistors being in turn connected to lines N and L2, according to one embodiment. The common node is connected to VIN+ and through a capacitor 48 to ground. Connections VREFIN and VREFOUT are connected through a capacitor 47 to connections VA– and DGND of measurement system 3. Connections VA+, VD+, and PFMON are connected to lines N and to ground through charge pump circuitry 49 including a first capacitor 33, a first resistor 34, first and second diodes respectively 35 and 36, a second capacitor 37, a zener diode 38, a third capacitor 39; first, second, third, and fourth resistors 31, 40, 41, and 43; and a fourth capacitor 42. The electric system 129 further includes, according to one embodiment, an oscillator 44 and a clock source 45, connected to connections XOUT and XIN, in the case of oscillator 44, and to XIN, in the case of optional clock source 45 (shown in phantom). The electric system 129 further includes a microcontroller 46 which is connected to the measurement system 3 at the connections SCLK, $\overline{CS}$, SDI, SDO, $\overline{INT}$, $\overline{EDIR}$, and $\overline{EOUT}$.

As shown in FIG. 4, the measurement system 3 is connected to operate 10 from a single +5V supply, according to one embodiment, or from dual plus and minus 2.5V supplies according to another embodiment. This permits provision of a 300 mV rms or 150 mV rms range for the current channel and to provide a 150 mvrms range for the voltage channel. With a single power supply, the measurement system 3 accommodates common mode signals of –0.25V to VA+. FIG. 4 further shows a configuration of the electric system 129 subject to measurement connected to a service to enable measurement of power in a single-phase two-wire system while operating in a single supply configuration. In particular, the electric system 129 includes a shunt resistor 232 for measuring current in line L2. Additionally, the electric system 129 includes a resistive voltage divider 32 for measuring voltage between lines N and L. The resistive divider 32 includes, according to one embodiment, first and second series resistors $R_1$ and $R_2$ connected to each other at a common node. The ends of the respective resistors not connected to the common node are respectively connected to line N or L.

Figure 5A:
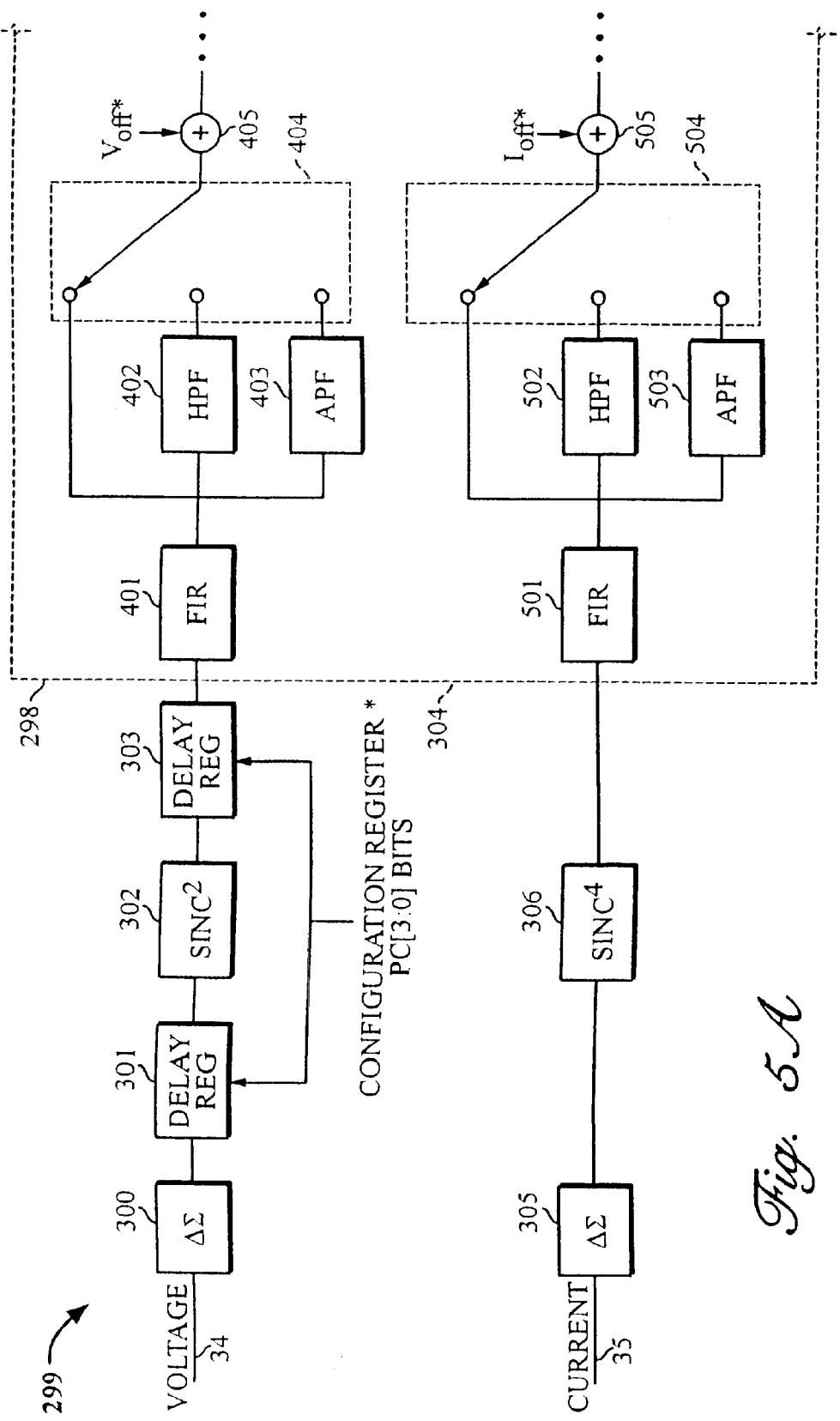
FIGS. 5A and 5B are a data flow diagram according to one embodiment of the present invention.
Figure 5B:
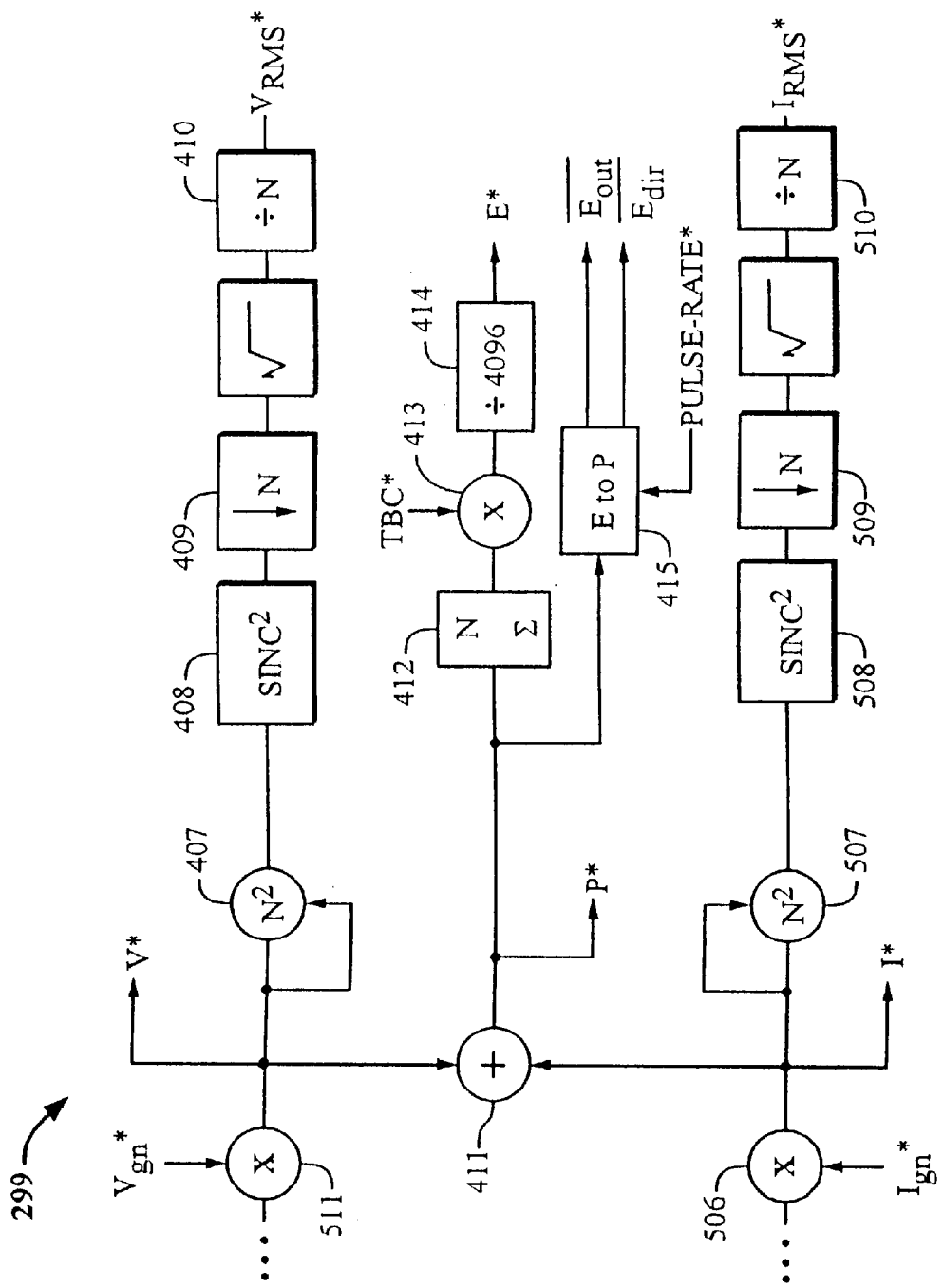

Referring now to FIGS. 5A and 5B, there is shown a data flow diagram according to one embodiment of the present invention. In the combined FIGS. 5A and 5B, there is shown an electrical system 299 according to the present invention. In the FIGS. 5A and 5B, there is shown a power calculation engine 298 according to the present invention, including sensors and ADCs, in which the delays of dV and dI in the voltage and current channels are compensated. In particular, the electrical system 299 includes a voltage channel 34, a current channel 35, and first and second delta sigma analog-to-digital converters 300 and 305 for the respective voltage and current channels 34 and 35. The electrical system 299 further includes first and second delay registers 301 and 303, first and second sinc filters 302 and 306, first and second finite impulse register (FIR) filters 401 and 501, first and second high pass filters 402 and 502, first and second all pass filters 403 and 503, first and second switches 404 and 504, and first and second additive voltage offset nodes 405 and 505. The voltage channel 34 carries an input differential voltage signal through a delta sigma analog-to-digital conversion 300, a first delay 301, second order sinc filtering 302, and a second delay 303, followed by FIR filtering 401. The current channel 35 carries an input differential current signal through a delta sigma analog-to-digital conversion 305, and fourth order sinc filtering 306, followed by FIR filtering 501. A decision is made as to whether to use the high pass filters 402 and 502 or the all pass filters 403 and 503. The power calculation engine 298 further includes first and second current signal gain multiplication nodes 511 and 506, a signal combination node 411, first and second squaring nodes 407 and 507; first and second sinc filters 408 and 508; first and second decimation filters 409 and 509; first and second dividers 410 and 510, an N sigma block 412 which sums up the power values, a signal combination node 412, a time based correction (TBC) element 413, an energy to pulse (E to P) conversion block 415 which produces an energy output value, an energy direction value, and a divide by 4096 scaling block 414 accomplished, for example, by a 12 bit shift. Once E is calculated, a predetermined compensation factor can be used to compensate the phases according to one embodiment of the present invention. The following equation relates energy to I and V in view of the delay between current and voltage: $E = I*V*\cos\theta$ where $\theta$ is a phase angle between I and V. In these filters, there is a fixed amount of time that one channel is delayed relative to the other channel. Depending on the phase error in the sensor, at one frequency, voltage and current are in phase, while at another frequency, voltage and current are at different phases. The oscillation frequency of V and I (e.g., 50 or 60 Hz) comes from a standard wall socket signal, for example. In the United States, the wall frequency is usually 60 Hz, and in Europe it is usually 50 Hz. Measurement according to the present invention begins with a start conversion command. The energy and rms registers are then updated every N conversions (i.e., each computation cycle), where N is the content of a cycle count register. After a computation cycle has been completed, a DRDY bit in a status and mask register is set, with the INTbar pin becoming active if the DRDY bit is unmasked. Based on information in the cycle count register, continuous computation cycles are repeatedly performed on voltage and current. After each computation cycle, DRDY is set. Thirty two SCLKS cycles are used to read a register, with the first eight being used to clock in the command to determine which results register is to be read and with the last 24 SCLK cycles being used to read the calculation result. Thus,; the user may acquire only application needed data, watching as DRDY rises and falls to indicated availability of new data. According to the present invention, a SINC2 operation precedes rms calculations. The high rate filter on the voltage channel is implemented as a fixed SINC2 filter compensated by a short length FIR filter.

Figure 5C:
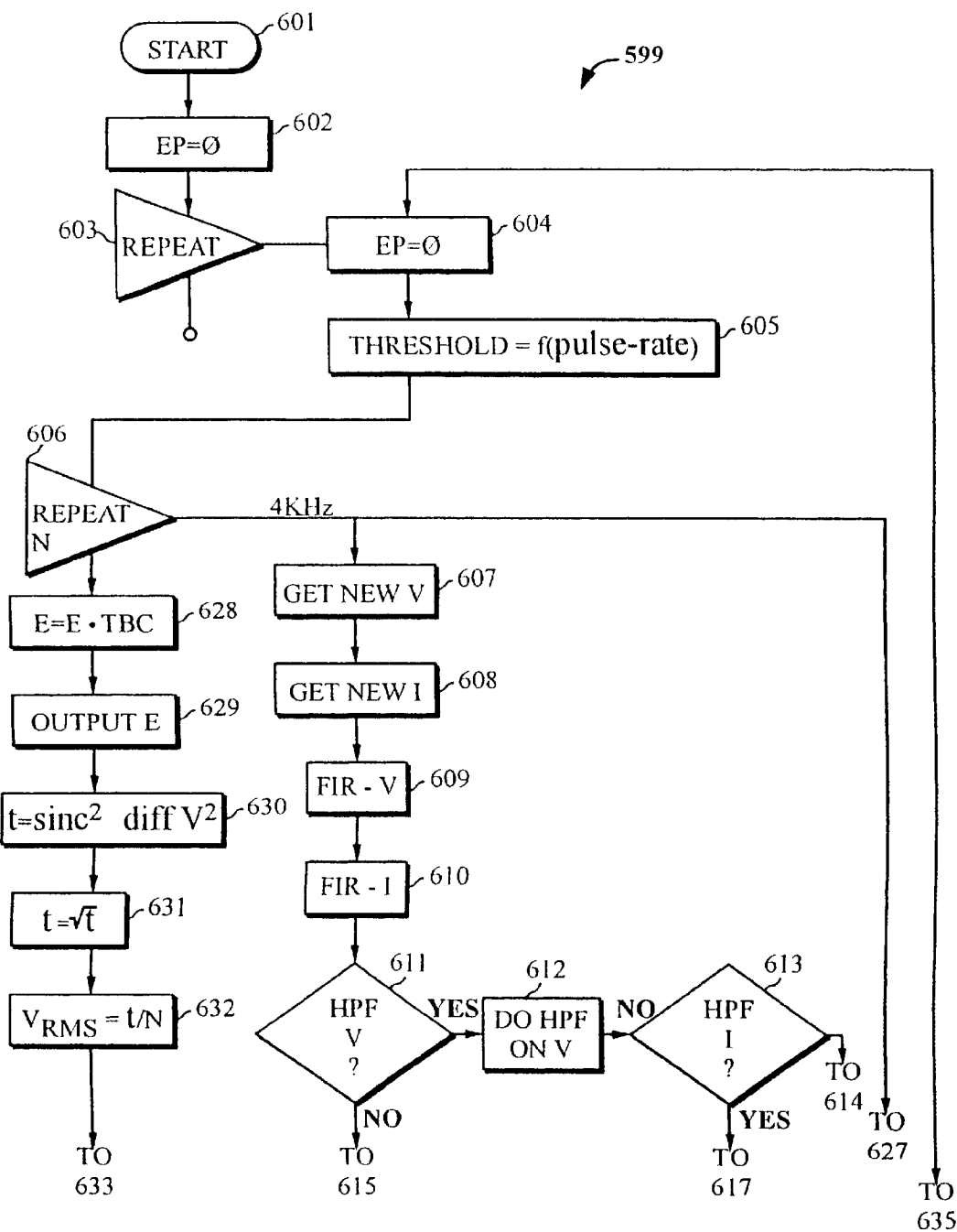
FIGS. 5C and 5D are a flow chart of a method according to the present invention.
Figure 5D:
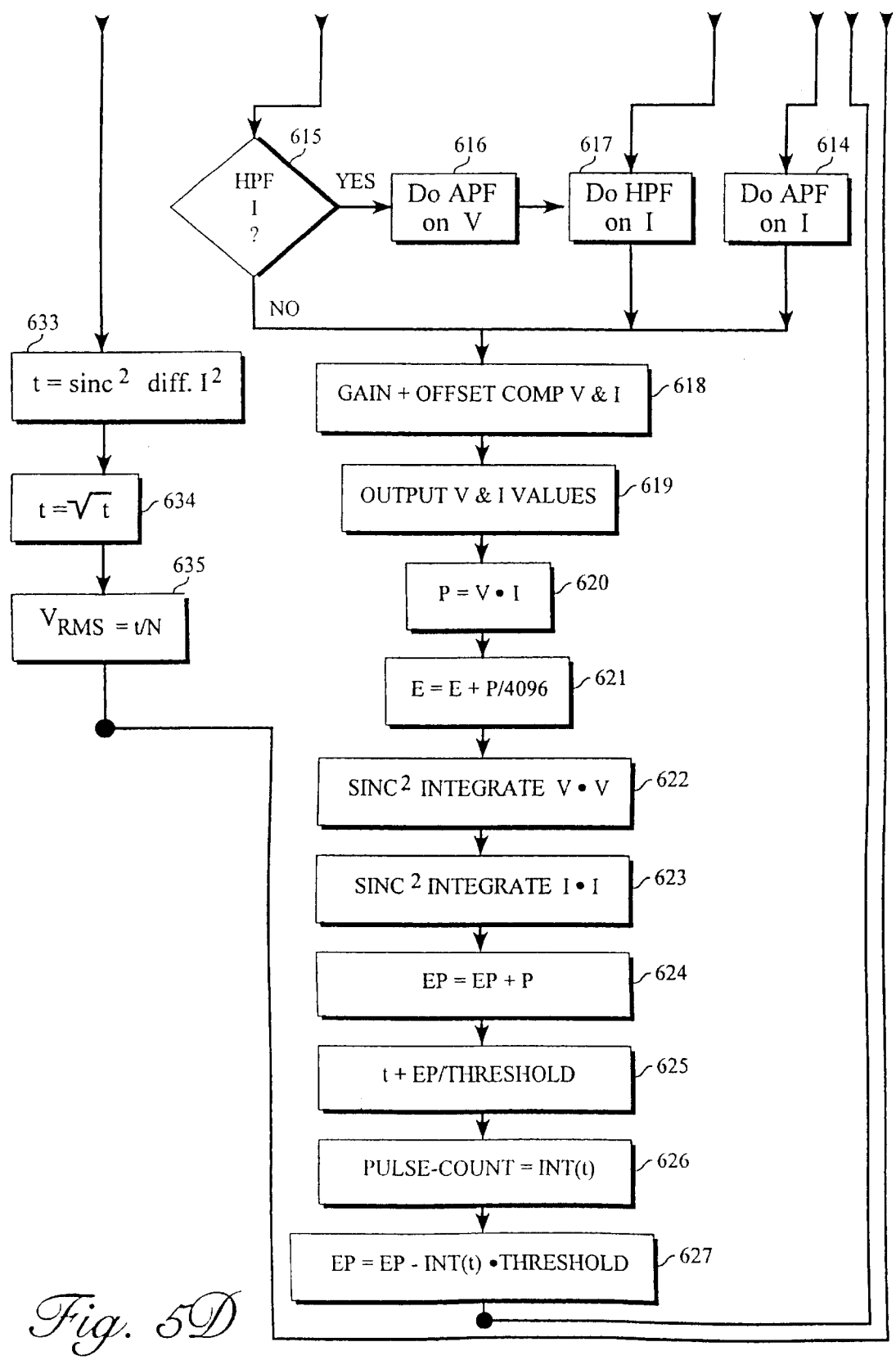

Referring now to FIGS. 5C and 5D, there is shown a flow chart of a method 599 according to the present invention, which expresses the calculation flow for determining power, energy, and rms voltage and current values. In particular, the calculation flow according to one embodiment of the present invention begins in step 601 and sets the energy pulse (EP) requirement to zero in step 602. The method according to the invention includes repeated loops, steps 603 and 606, as follows. The inner loop step 606 is repeated N times at a frequency of 4 KHz for example, where N is a selected integer. To begin, the energy is set to zero in step 604. Next, a threshold value is set equal to a function of the pulse-rate in step 605. Operation in the secondary loop 606 includes obtaining a new voltage value in step 607, obtaining a new current value in step 608, filtering the voltage value with a finite impulse response filter in step 609, filtering the current value with a finite impulse response filter in step 610, and determining whether to apply a high pass filter to the finite impulse response voltage value in step 611. If the voltage value is to be high pass filtered, then the voltage value is in fact high pass filtered in step 612. Then a determination is made as to whether to high pass filter the current value in step 613. If no at step 613, an all pass filter is applied to the current value in step 614. If yes at step 613, then the current value is high pass filtered in step 617. If the voltage value is not to be high pass filtered, then a determination is made as to whether to high pass filter the current value in step 615. If yes at step 615, then the voltage value is high pass filtered in step 616, and the current value is high pass filtered in step 617. Then the current and voltage values are offset compensated in step 618, and the resultant voltage and current values are output in step 619. Thereafter, the value of power is determined and output, as a function of multiplying the current and voltage values in step 620. Next, energy is determined by summing a current energy value with the value of power divided by a scaling factor as for example the value 4096. Next, the value of voltage squared is sinc squared integrated in step 622. Further, the value of current squared is sinc squared integrated in step 623. Then, an energy pulse value is determined by adding the current energy pulse value to the power in step 624. Then, a temporary register is set equal to the energy pulse value divided by the threshold value. Next, the integer value of the pulse count as a function of time is determined in step 626. Thereafter, the energy pulse value is redetermined by subtracting from the former energy pulse value the integer value of the threshold in step 627. For each completion of the subloop, the energy is set equal to the present energy value times a time based correction in step 628. Then, the energy value as modified is output in step 629. Then, the temporary register is set equal to the squared voltage value subject to second order differential filtering in step 630. This value is then reset as its own square root in step 631. Then, the rms voltage is determined as the value of the temporary register divided by N, the current loop value in step 632. Thereafter, the temporary register value is set equal to the value of the current squared subject to differential second order sinc filtering in step 633. Again, the value of the temporary register is reduced to its own square root in step 634. The rms current is the value of the temporary register divided by N, the current loop value, in step 635. After determination of the rms voltage and current values, the energy register is reinitialized in step 604, the threshold is recomputed in step 605, and the inner loop is repeated in step 606. The outer loop is repeated in step 603 until operation is affirmatively terminated by the user, according to one embodiment of the present invention.

Figure 6:
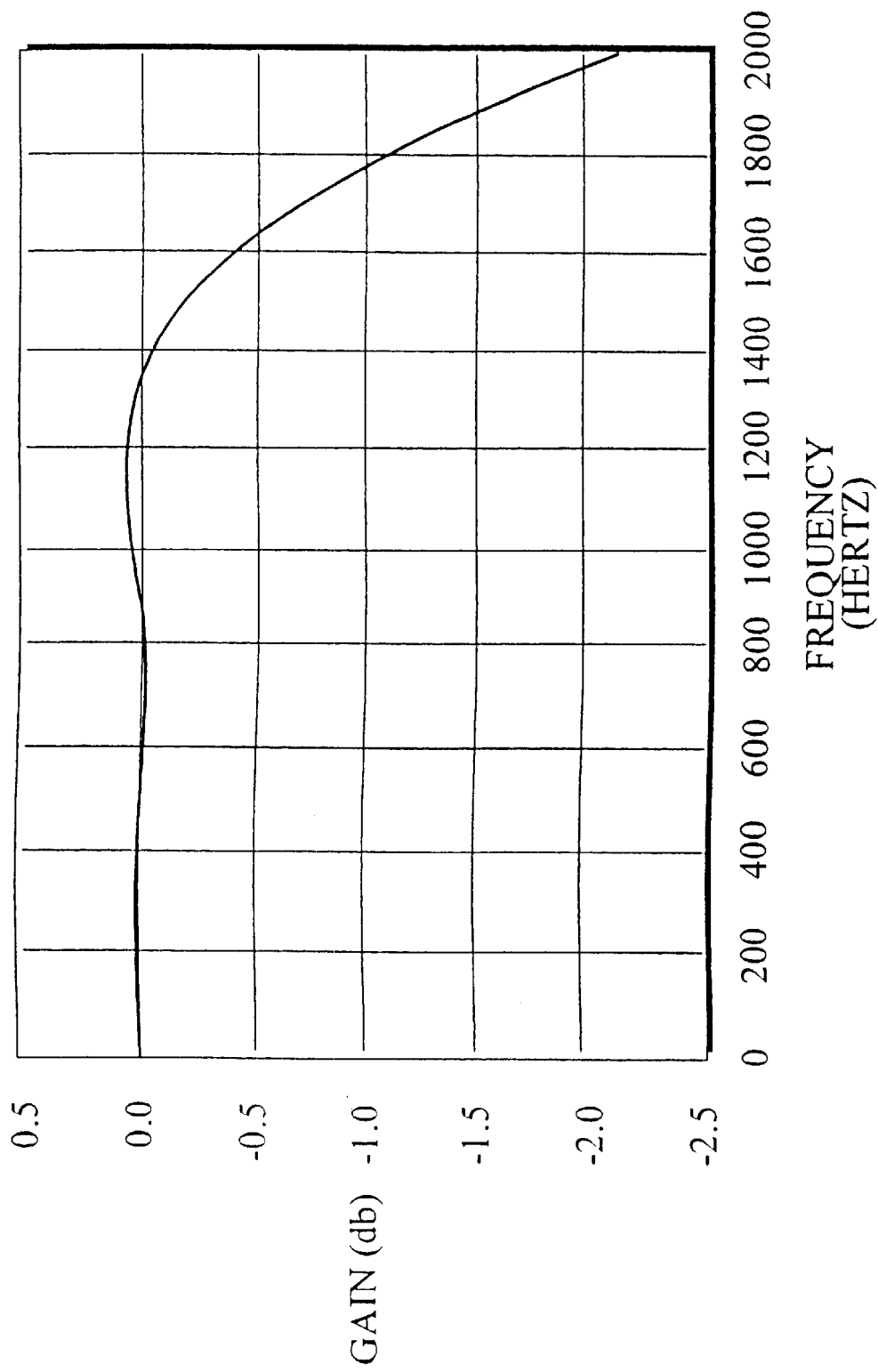
FIG. 6 is a diagram of voltage input filter roll off according to one embodiment of the present invention.

Referring now to FIG. 6, there is shown a diagram of voltage input filter roll off according to one embodiment of the present invention, for a fixed SINC2 filter when the converter device is driven with a 4.096 MHz clock (K=1). The filter's response scales with MCLK frequency and divisor K.

Figure 7:
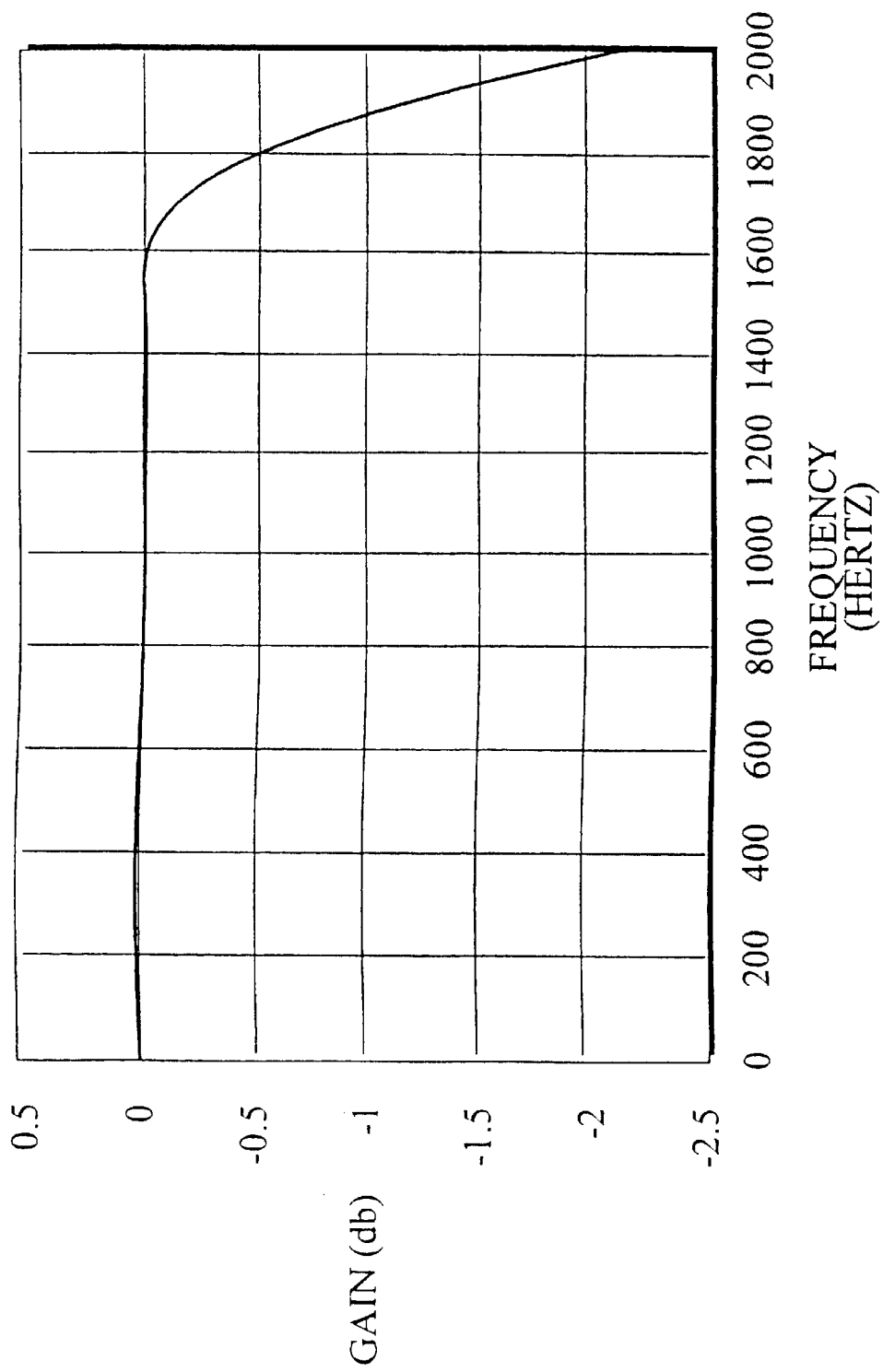
FIG. 7 is a diagram of current input filter roll off according to one embodiment of the present invention.

Referring now to FIG. 7, there is shown a diagram of current input filter roll off according to one embodiment of the present invention, based upon a sinc4 filter compensated with a short length FIR. When the converter is driven with a 4.096 MHz clock (K=1), the response shown in FIG. 7 is achievable.

Figure 8:
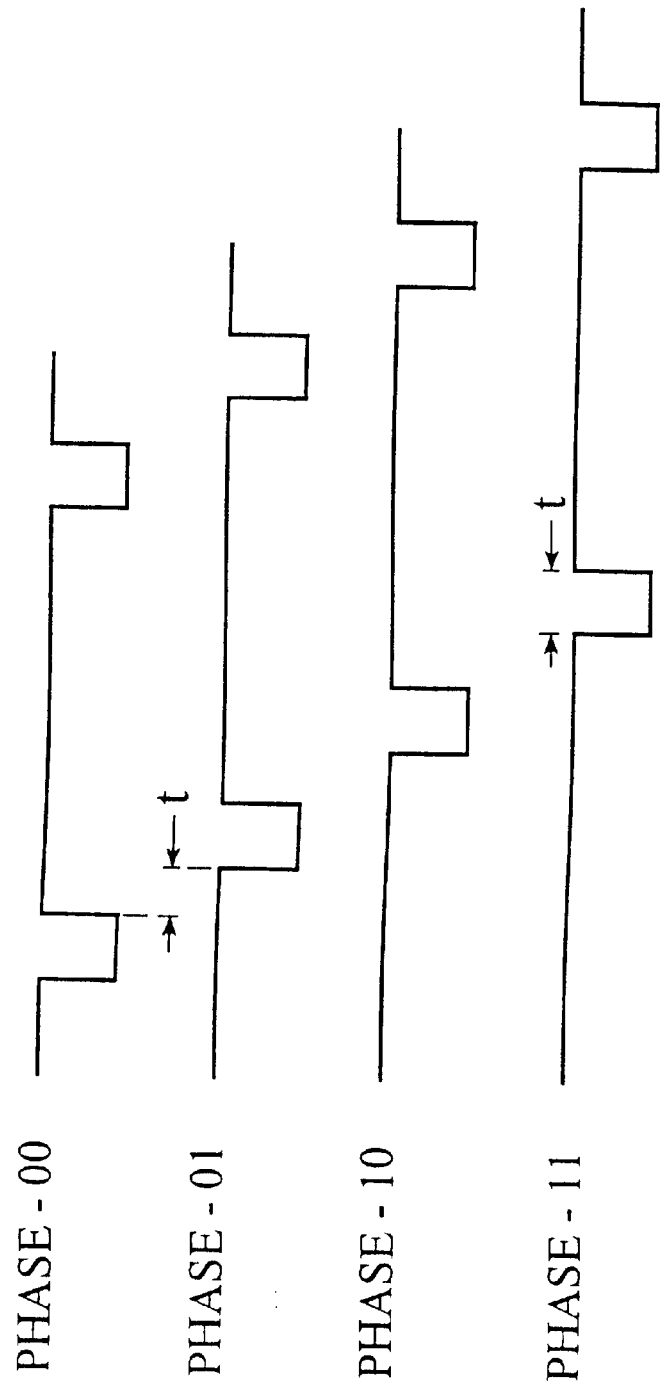
FIG. 8 is a timing diagram of a multi-phase system according to one embodiment according to the present invention.

Referring now to FIG. 8, there is shown a timing diagram of a multi-phase system according to one embodiment according to the present invention. The period for the multi-phase system is substantially the pulse-rate register period/8, which equals N/(MCLK/K) for a integer N.

Figure 9:
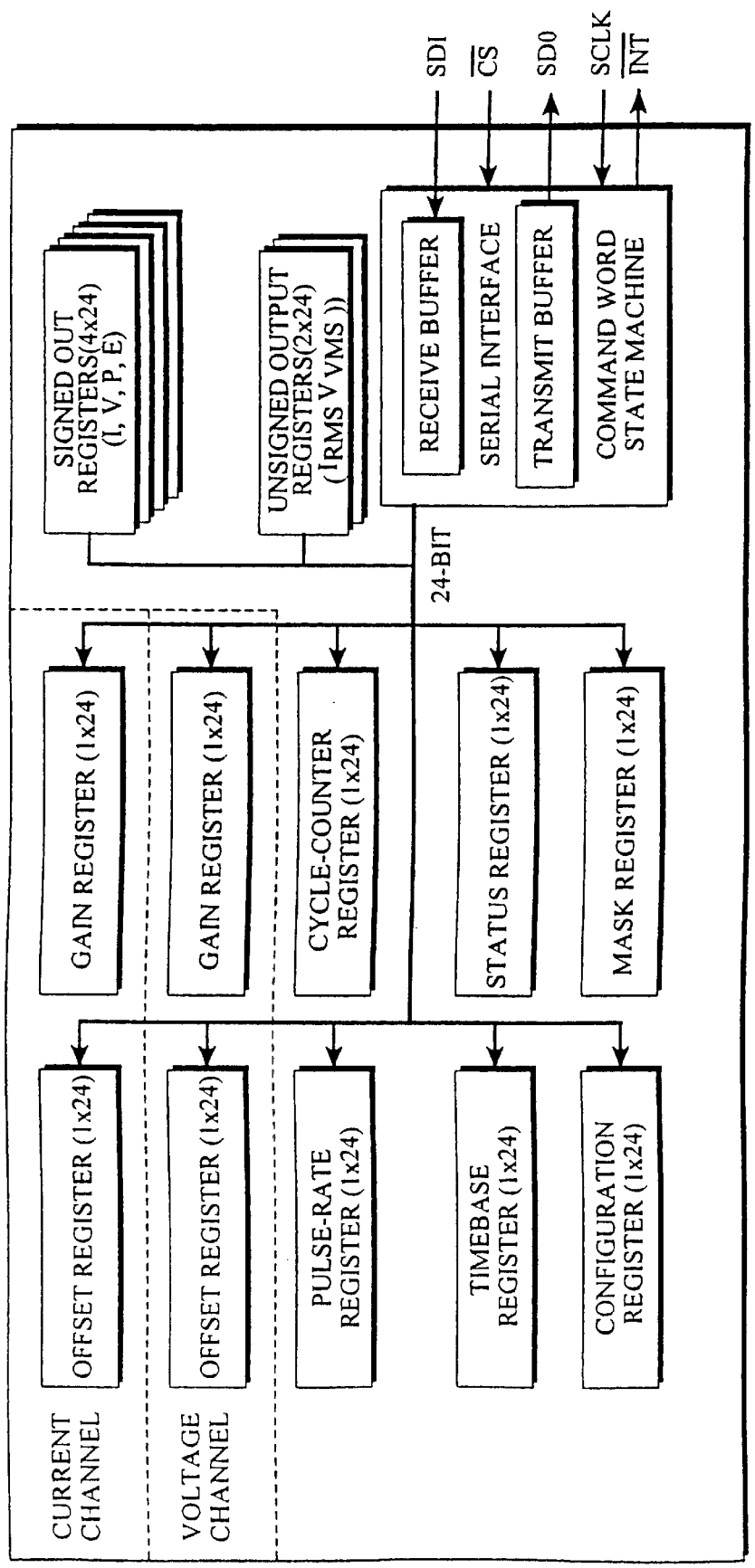
FIG. 9 is a register diagram of a system according to one embodiment according to the present invention.

Referring now to FIG. 9, there is shown a register diagram of a system according to one embodiment according to the present invention, showing user accessible registers. The serial port of the system includes a state machine with transmit receive buffers. The state machine interprets 8-bit command words on the rising edge of an SCLK cycle. Upon decoding of the command word, the state machine performs the requested command or prepares for a data transfer of the addressed register. Request for read requires an internal register transfer to the transmit buffer, while a write operation is delayed until the completion of 24 SCLK cycles before performing a transfer. The internal registers are used to control the ADC's functions. The registers according to one embodiment of the present invention are 24 bits in length.

Figure 10:
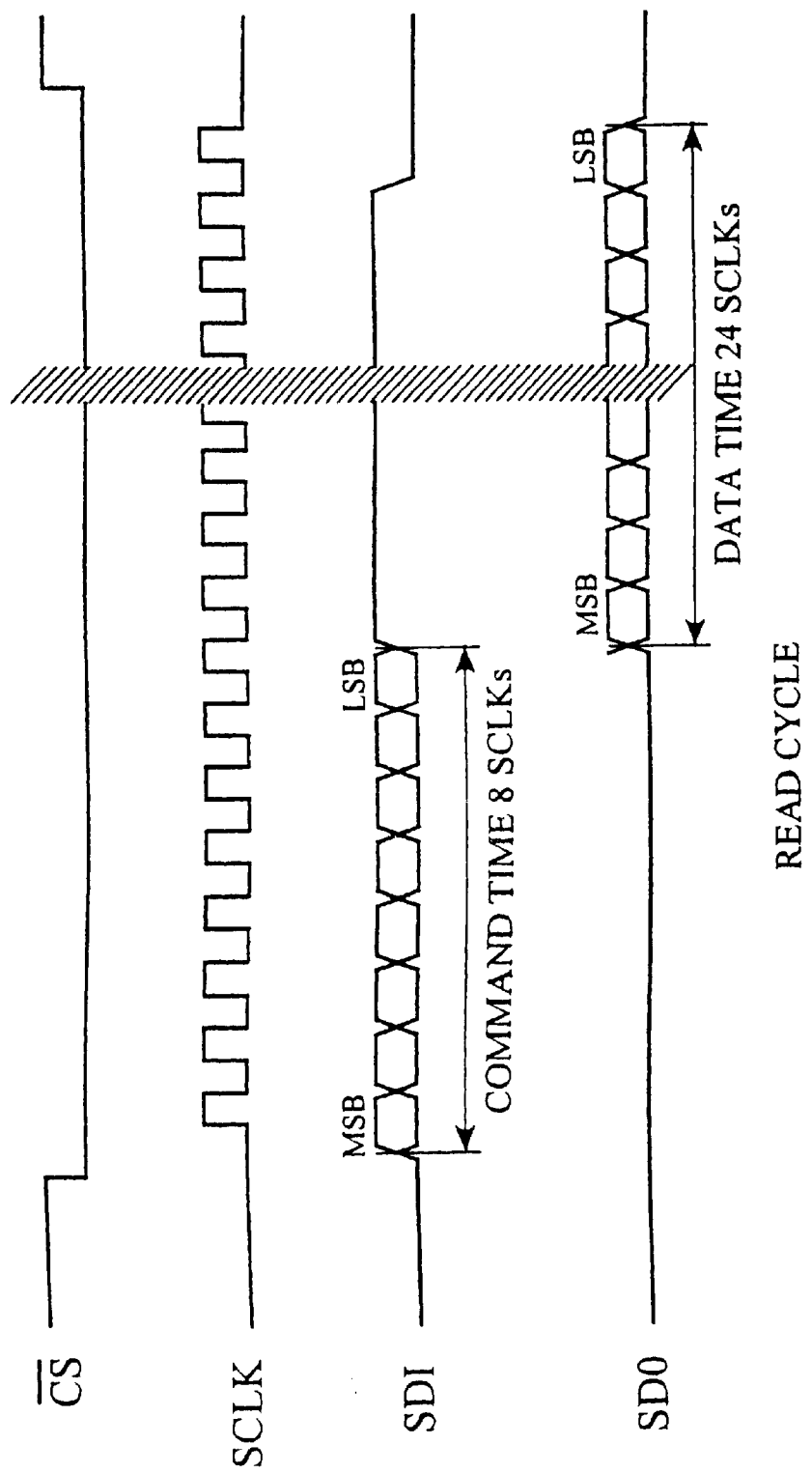
FIG. 10 is a timing diagram of a system according to one embodiment of the present invention.

Referring now to FIG. 10, there is shown a timing diagram of a system according to one embodiment of the present invention. In particular, the Figure illustrates the serial sequence needed according to one embodiment of the present invention, to write to, or read from the serial port's buffers. The serial bit clock controls the shifting of data to or from the ADC's serial port. The Csbar pin is held at logic zero before SCLK transitions are recognized by the port logic. To accomodate opto-isolators, the SCLK source includes a Schmitt Trigger input signal to allow an opto-isolator with slow rise and fall times to directly drive the pin. As shown in FIG. 10, a transfer of data is initiated by sending an 8-bit command to the serial port. When a command involves a write operation, the serial port clocks in data bits on the SDI pin for the next 24 SCLK cycles. When a read command is initiated, the serial port transfers register content bits on the SDO pin for the next 8, 16, or 24 SCLK cycles depending on the command issued.

What is claimed is:

1. An analog-to-digital converter system comprising:

first and second delta sigma analog-to-digital converters respectively configured to receive first and second input signals respectively indicative of electric current and voltage values, said first and second delta sigma analog-to-digital converters being configured to convert input analog signals into corresponding digital signals and said first and second delta sigma analog-to-digital converters include a fourth order delta sigma modulator and a second order delta sigma modulator;

a calculation engine for receiving digital representations of said first and second input signals from said first and second delta sigma analog-to-digital converters and for performing selected operations on said digital representations such that said current and voltage values are combined, and a serial interface connected to said calculation engine;

wherein the first and second delta sigma analog-to-digital converters, the calculation engine, and the serial interface are fabricated on a single semiconductor chip and the calculation engine is configured to calculate energy, power, rms current and voltage for single phase 2 or 3 wire power quality measurements.

2. The analog to digital converter system according to claim 1, wherein said converters are adapted for measuring voltage and current respectively with a shunt or transformer and a divider or transformer.

3. The analog to digital converter system according to claim 1, wherein said calculation engine is configured to calculate energy at an energy data accuracy of approximately 0.1% in one second over a 300:1 dynamic range.

4. The analog to digital converter system according to claim 1, wherein said serial interface is bidirectional for communication with a microprocessor or controller.

5. The analog to digital converter system according to claim 1, wherein said serial interface provides a fixed width programmable frequency output proportional to energy for a particular frequency range.

6. The analog to digital converter system according to claim 1, wherein said converter system is user system calibratible to provide an offset to facilitate power calculations.

7. A measurement system comprising:
- a programmable gain amplifier (PGA) for receiving current measurement signals;
- an analog-to-digital (A/D) modulator system connected to the PGA wherein said modulator system includes a fourth order delta sigma modulator and a second order delta sigma modulator;
- a digital filter system connected to the modulator system; and
- a calculation engine for making predetermined measurements based upon current.

8. A measurement system according to claim 7, further comprising first and second high pass filters for connecting the calculation engine to the modulator system.

9. The measurement system according to claim 8, wherein said first and second high pass filters are configured to remove DC content from the voltage and current signals channels prior to information processing by said calculation engine.

10. The measurement system according to claim 7, further comprising:
- an energy to pulse (E-to-P) converter, a calibration SRAM, and a watchdog timer.

11. The measurement system according to claim 7, further comprising a serial interface connected to said calculation engine.

12. The measurement system according to claim 11, further comprising first and second amplifiers respectively configured to receive current and voltage signals.

13. The measurement system according to claim 11, wherein said serial interface is bi-directional and enables communication with a microcontroller and provides a fixed-width programmable frequency output that is proportional to energy.

14. The measurement system according to claim 7, further comprising first and second digital filters configured to produce output data at a (MCLK/K)1024 output word rate (OWR).

15. The measurement system according to claim 7, further comprising two delta sigma analog-to-digital converters, a plurality of electrical and power calculation functions, and a serial interface on a single semiconductor chip.

16. The measurement system according to claim 7, wherein said measurement system is configured to measure and calculate energy, instantaneous power, root mean square current, and root mean square voltage for single phase two or three wire power meter applications.

17. The measurement system according to claim 7, wherein said measurement system is configured to interface to a shunt or transformer to measure current and to a resistive divider or transformer to measure voltage.

18. The measurement system according to claim 7, wherein said measurement system is configured to enable user controlled system-level calibration.

19. The analog to digital converter system according to claim 1, further comprising first and second digital filters configured to produce output data at a (MCLK/K)/1024 output word rate (OWR).

20. An analog-to-digital converter system comprising:
- first and second delta sigma analog-to-digital converters respectively configured to receive first and second input signals respectively indicative of electric current and voltage values, said first and second delta sigma analog-to-digital converters being configured to convert input analog signals into corresponding digital signals;
- a calculation engine for receiving digital representations of said first and second input signals from said first and second delta sigma analog-to-digital converters and for performing selected operations on said digital representations such that said current and voltage values are combined,
- a serial interface connected to said calculation engine, and
- first and second digital filters configured to produce output data at a (MCLK/K)1024 output word rate (OWR);
- wherein the first and second delta sigma analog-to-digital converters, the calculation engine, and the serial interface are fabricated on a single semiconductor chip and the calculation engine is configured to calculate energy, power, rms current and voltage for single phase 2 or 3 wire power quality measurements.

21. A measurement system comprising:
- a programmable gain amplifier (PGA) for receiving current measurement signals;
- an analog-to-digital (A/D) modulator system connected to the PGA;
- a digital filter system connected to the modulator system;
- a calculation engine for making predetermined measurements based upon current; and
- first and second digital filters configured to produce output data at a (MCLK/K)1024 output word rate (OWR).

* * * * *